United States Patent
Huang et al.

[11] Patent Number: 6,163,179
[45] Date of Patent: Dec. 19, 2000

[54] VOLTAGE LEVEL TRANSFER

[75] Inventors: Jincheng Huang; Ta-Hsiu Huang, both of Taipei; Yuangtsang Liaw, Taichung, all of Taiwan

[73] Assignee: VIA Technologies, Inc., Taipei Hsien, Taiwan

[21] Appl. No.: 09/286,217

[22] Filed: Apr. 5, 1999

[30] Foreign Application Priority Data

Dec. 10, 1998 [TW] Taiwan ................................ 87120496

[51] Int. Cl.$^7$ ...................................................... H03K 3/00
[52] U.S. Cl. .......................... 327/108; 327/333; 326/62; 326/63; 326/83
[58] Field of Search ........................... 327/108–112, 170, 327/333, 374, 376, 377, 434, 436, 544; 326/62, 63, 68, 80–83

[56] References Cited

U.S. PATENT DOCUMENTS

| 4,491,749 | 1/1985 | Iwamura | 326/58 |
| 5,406,140 | 4/1995 | Wet et al. | 326/68 |

*Primary Examiner*—Kenneth B. Wells
*Attorney, Agent, or Firm*—J. C. Patents; Jiawei Huang

[57] ABSTRACT

A single-end-input voltage level transfer is provided to transfer a first signal into a second signal. The voltage level transfer has a first, a second, a third, and a fourth transistors, a first inverter, and a second inverter, in which the first transistor is an NMOS transistor and the other three are PMOS transistors. A first transistor source is coupled to the first signal. An input end of the first inverter is coupled to a first transistor drain. An output end of the first inverter is coupled to an input end of the second inverter, which exports the second signal. A second transistor source is coupled to a first power source, and a second transistor drain is coupled to a first transistor gate. A second transistor gate is controlled by a complementary second signal. A third transistor source is coupled to a second power source, and a third transistor drain is coupled to the first transistor gate. A third transistor gate is controlled by the second signal. A second transistor substrate and a third transistor substrate are coupled to the second power source. A fourth transistor source is coupled to the second power source. A fourth transistor drain is coupled to first transistor drain. A fourth transistor gate is coupled to the complementary second signal.

19 Claims, 14 Drawing Sheets

VOLTAGE LEVEL TRANSFER

CROSS-REFERENCE TO RELATED APPLICATION

This application claims the priority benefit of Taiwan application serial no. 87120496, filed Dec. 10, 1998, the full disclosure of which is incorporated herein by reference.

BACKGROUND OF THE INVENTION

1. Field of the Invention

This invention relates to an electronic circuit architecture, and more particularly to a voltage level transfer with a single-end input signal controlled by a gate voltage.

2. Description of Related Art

As the semiconductor fabrication technology achieves to deep sub-micron level, and an IC device with less power consumption is more strongly desired, an internal IC working voltage has been brought down from 5V at the early stage down to 3.3V, 2.5V, or even 1.8V for the current stage. For all of these various IC devices, they should satisfy a standard bus specification so that an external IC voltage level is maintained a standard voltage level, and cannot vary as the internal IC working voltage.

Figure 1:
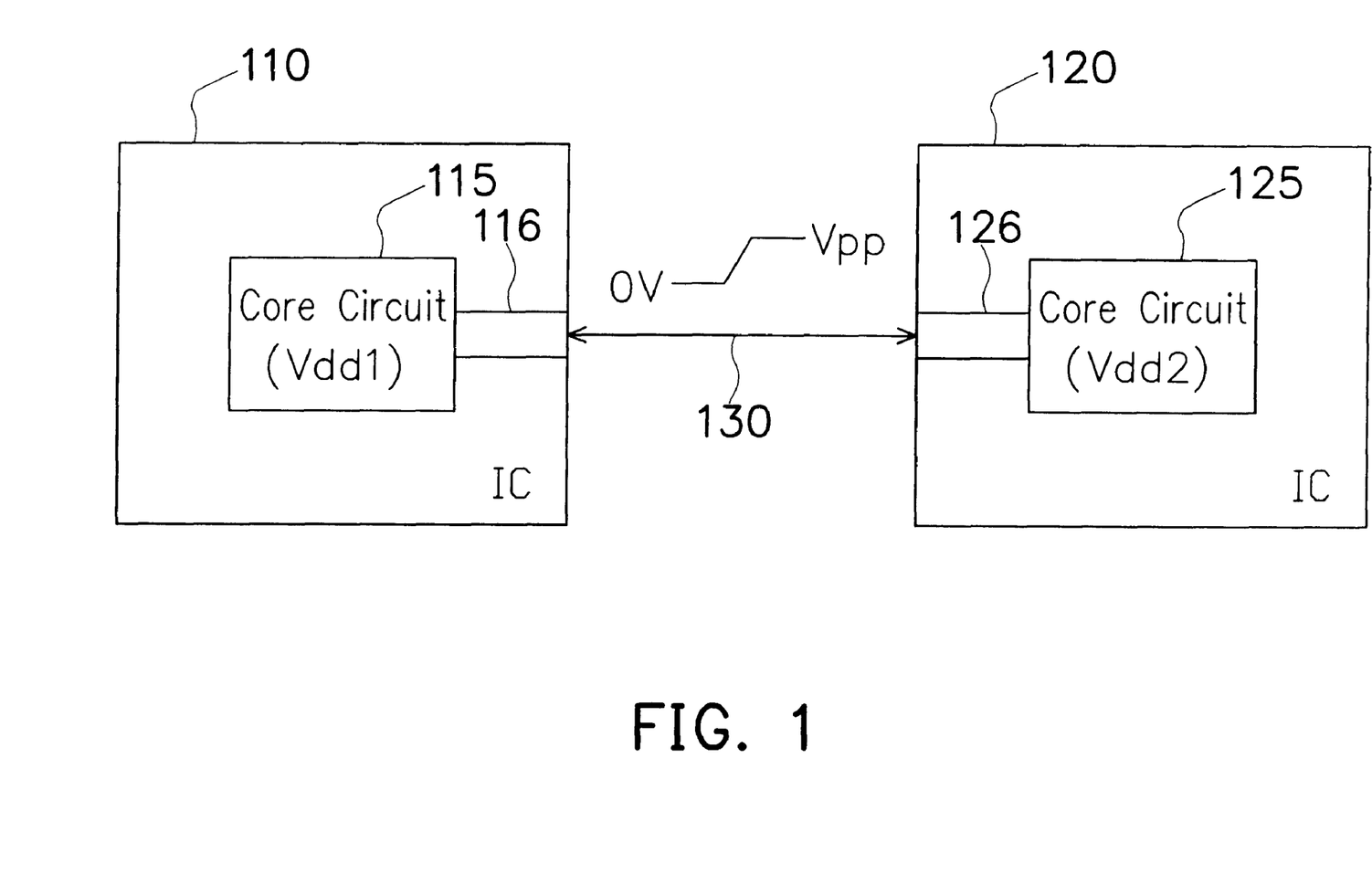
FIG. 1 is a circuit diagram, schematically illustrating a signal transmission between two IC devices.

FIG. 1 is a typical circuit diagram, schematically illustrating a signal transmission between two IC devices. In FIG. 1, two IC devices 110, 120 have a common data bus with a standard voltage $V_{pp}$ of, for example, 3.3V for a signal transmitting between each other through a signal line 130, but they may have different internal IC working voltages. For example, the IC device 110 has a core circuit 115 with an internal working voltage $V_{dd1}$ of 3.3V, 2.5V or even as low as 1.8V. Similarly, the IC device 120 has a core circuit 125 with an internal working voltage $V_{dd2}$ of 3.3V, 2.5V or even as low as 1.8V. Since the core circuits 115, 125 have different internal working voltage from the standard bus voltage $V_{pp}$, they respectively employ a voltage level transfer 116 and a voltage level transfer 126 so as to match the standard bus voltage $V_{pp}$ carried by the signal line 130.

Figure 2A:
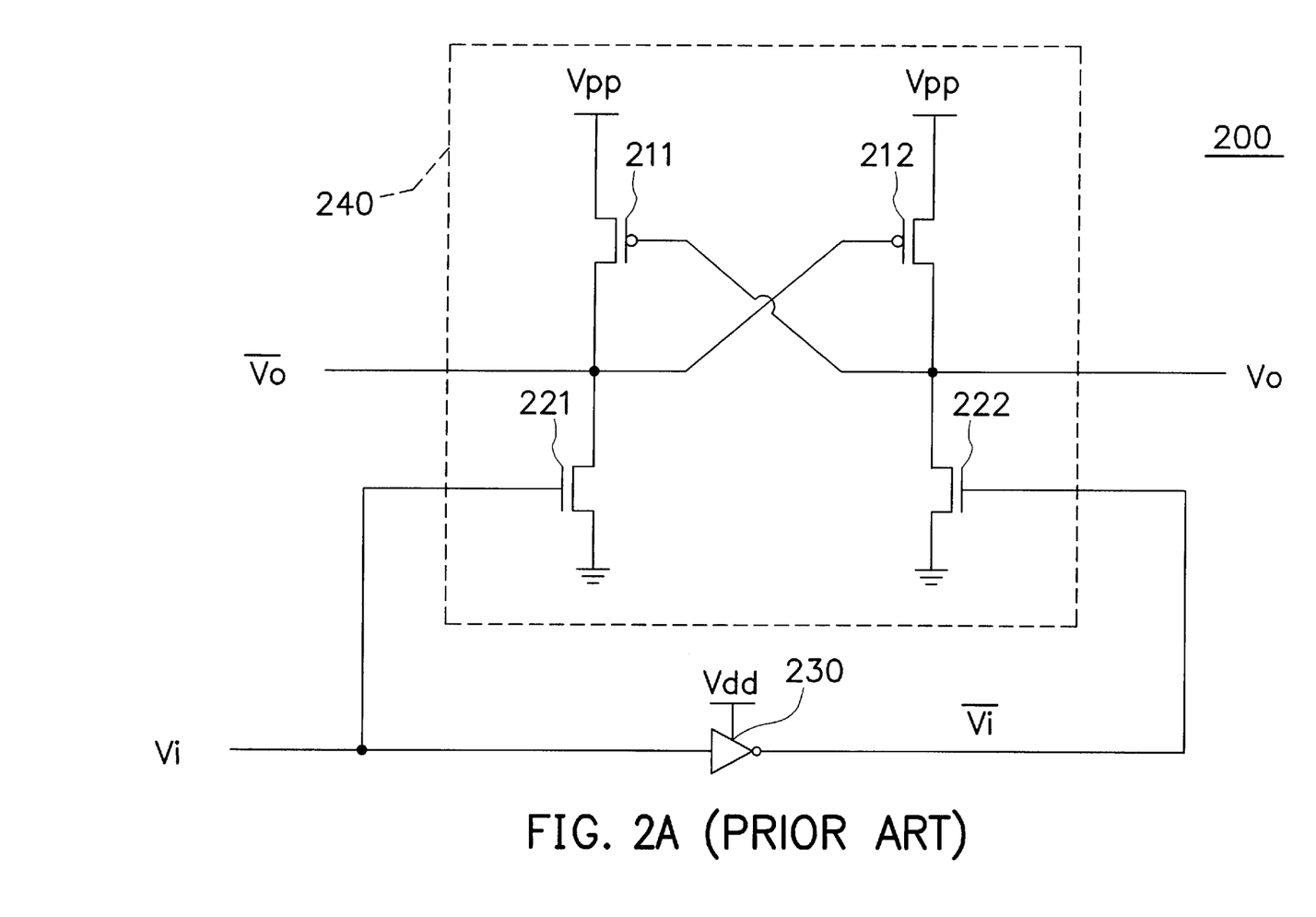
FIG. 2A is a circuit configuration, schematically illustrating a conventional circuit architecture of a differential-input voltage level transfer.

FIG. 2A is a circuit configuration, schematically illustrating a conventional circuit architecture of a differential-input voltage level transfer. In FIG. 2A, a conventional voltage level transfer 200 includes an inverter 230 and several complementary metal-oxide semiconductor (CMOS) transistors 211, 212, 221, and 222. An input signal Vi is sent in and inverted by the inverter 230 to obtain a complementary input signal $\overline{Vi}$, which is continuously sent to the transistor 222 at its gate, and the input signal Vi is simultaneously sent to the transistor 221 at its gate. So, a sub-circuit 240 has Vi and $\overline{Vi}$ differential-input signals. In this manner, one and only one of the transistors 221 and 222 is turned on at a time. The transistors 211 and 212 are respectively coupled to the transistors 222 and 221 so as to have a positive feedback structure. The positive feed back structure can raise a voltage of the input signal Vi or its complementary input signal $\overline{Vi}$ so that one of an output signal Vo and its complementary output signal $\overline{Vo}$ is obtained with a higher voltage level.

Figure 2B:
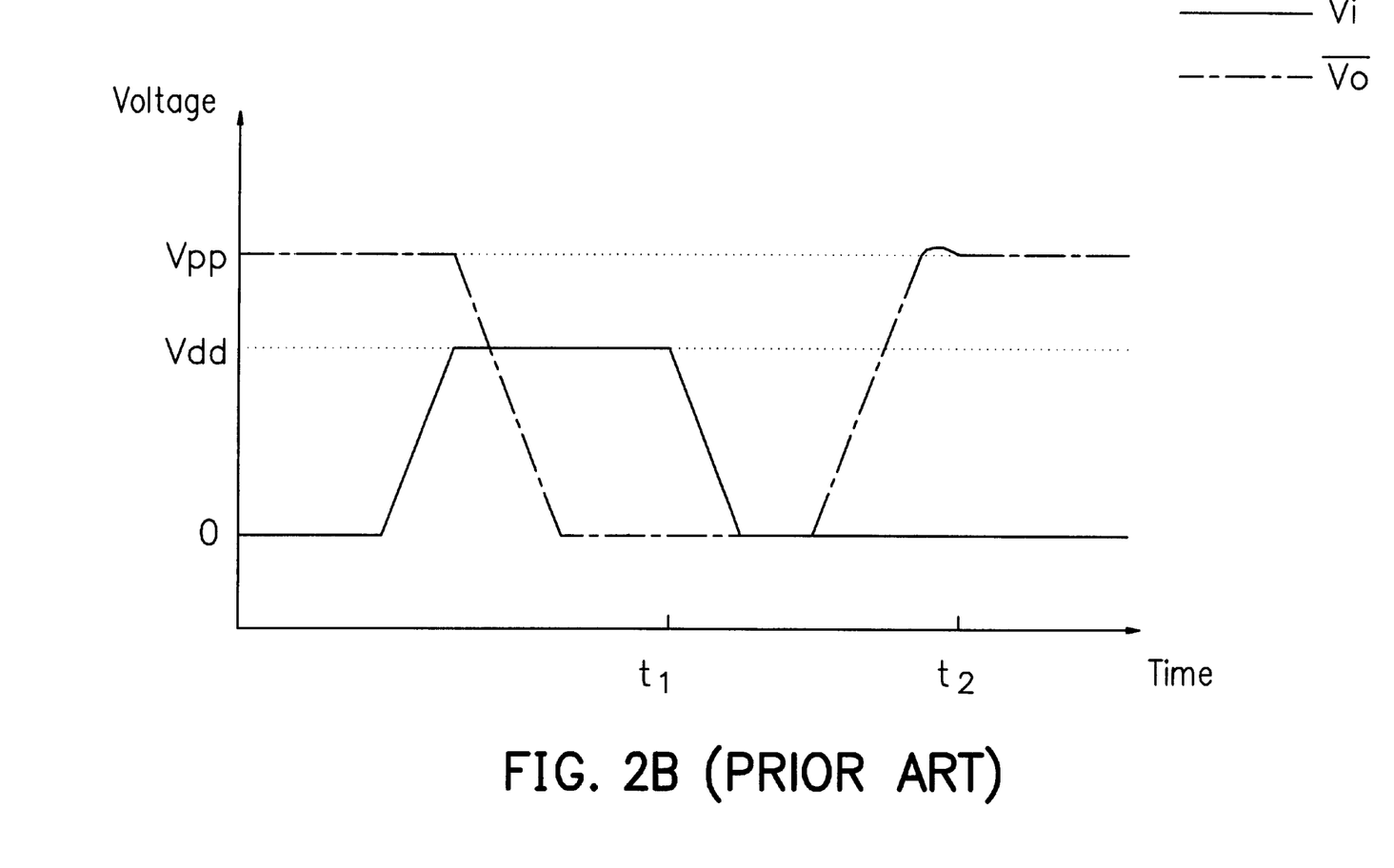
FIG. 2B is a plot of voltage waveforms versus time, schematically illustrating voltage waveforms of the input signal Vi and the complementary output signal $\overline{Vo}$ of FIG. 2A.

FIG. 2B is a plot of voltage waveforms, schematically illustrating voltage waveforms of the input signal Vi and the complementary output signal $\overline{Vo}$ versus time. In FIG. 2B, at a time t1, the input signal Vi has a voltage level of $V_{dd}$, and the complementary output signal $\overline{Vo}$ has a voltage of 0V. As a result, the transistor 221 is turned on and the transistor 222 is turned off. The voltage level transfer 200 has a design that the driving ability of the transistors 221 and 222 is higher than the driving ability of the transistors 211 and 212 so that as the transistor 221 is turned on, the complementary output signal $\overline{Vo}$ stays at 0V, which consequently turned on the transistor 212. As a result, the transistor 211 stays "off". Since the transistor 222 is turned off and the transistor 212 is turned on, the output voltage Vo is at the voltage level of $V_{pp}$.

As the voltage status of the input signal Vi transits from $V_{dd}$ to 0V, its complementary input signal $\overline{Vi}$ has a voltage of $V_{dd}$. During voltage transition period, the transistor 211 is not turned on yet at the beginning, but the transistor 221 is turn off and the complementary output signal $\overline{Vo}$ still stays at 0V. As time going, the transistor 222 is gradually turned on, and the transistor 211 is consequently turned on. Since the complementary output signal $\overline{Vo}$ controls the transistor 212 at its gate, the transistor still at 'on' status. As a result, at this instant time, both the transistor 222 and the transistor 212 are at "on" status, in which they are coupled in series. Because the driving ability of the transistor 222 is greater than the driving ability of the transistor 212, the voltage $V_{ds}$ of the transistor 222 is greater than the voltage $V_{sd}$ of the transistor 212. This causes that the voltage of the output signal Vo begins to decrease from a $V_{pp}$, and the transistor 211 is gradually turned on. The voltage of the complementary output signal $\overline{Vo}$ therefore begins to decrease, and the transistor 212 is gradually turned off. This causes the voltage of the output signal Vo to be more easily decreased. As this positive feedback circulation goes on, the output signal Vo obtains a voltage of 0V, and its complementary output signal $\overline{Vo}$ obtains a stable voltage of $V_{pp}$ at the time t2.

The conventional voltage level transfer 200 can modify the voltage level carried by the input signal so that the internal working voltage used by the core circuits 115 and 125 of FIG. 1 can match to the standard bus voltage. During the voltage transition period, the transistor 211 and the transistor 221, or the transistor 212 and the transistor 222, are turned on at the same time. The output signal Vo or its complementary output signal $\overline{Vo}$ with the desired voltage level are done by making use of the higher driving ability of the transistor 221, or the transistor 222. However, since the transistor 211 and the transistor 221, or the transistor 212 and the transistor 222, are coupled in series between the power source $V_{pp}$ and the ground, and are turned on at the same time, it takes long to transfer the voltage level form internal level to the standard bus level due to a slow response time. This causes an obvious effect of power consumption of a whole IC device, which usually includes several IC devices. This power consumption is a conventional issue which should be solved.

SUMMARY OF THE INVENTION

It is an objective of the present invention to provide a single-end-input voltage level transfer controlled by a gate voltage so as to reduce the voltage transfer time and its power consuming rate. The single-end-input means that the circuit doesn't need a complementary input signal $\overline{Vi}$ to get the desired functions.

In accordance with the foregoing and other objectives of the present invention, a single-end-input voltage level transfer is provided. The voltage level transfer can transfer a first signal into a second signal. The voltage level transfer includes a first transistor, a second transistor, a third transistor, a fourth transistor, a first inverter, and a second inverter.

A first source region of the first transistor is coupled to the first signal. An input end of the first inverter is coupled to a first drain region of the first transistor. An output end of the first inverter is coupled to an input end of the second inverter, which exports the second signal. And a complementary second signal is produced by the first inverter between the first inverter and the second inverter.

A second source region of the second transistor is coupled to a first power source $V_{dd}$, and a second drain region of the second transistor is coupled to a first gate of the first transistor. A second gate of the second transistor is controlled by the complementary second signal. A third source region of the third transistor is coupled to a second power source $V_{pp}$, and a third drain region of the third transistor is coupled to a first gate of the first transistor. A third gate of the third transistor is controlled by the second signal. A second substrate voltage of the second transistor and a third substrate voltage of the third transistor are commonly coupled to the second power source $V_{pp}$.

A fourth source region of the fourth transistor is coupled to the second power source $V_{pp}$. A fourth drain region of the fourth transistor is coupled to the first drain region that is the input end of the first inverter. A fourth gate of the fourth transistor is coupled to the complementary second signal. The fourth transistor has relatively small driving ability.

In the foregoing, the first signal includes an amplitude between 0V and the first power source $V_{dd}$, and the second signal includes an amplitude between 0V and the second power source $V_{pp}$. Therefore, the first inverter and the second inverter are coupled to the second power source $V_{pp}$.

The first transistor includes an N-type metal-oxide semiconductor (NMOS) transistor, and each of the other three transistors includes a P-type metal-oxide semiconductor (PMOS) transistor.

Moreover, in order to enhance the driving ability, a third inverter and a fourth inverter can be further included. An input end of the third inverter is coupled to the input end of the first inverter, and an output end of the third inverter with an output of the complementary second signal is coupled to an input end of the fourth inverter and a first load, which is further grounded at its other end. The output end of the fourth inverter with the second signal is coupled to a second load, which is grounded at its other end. The third inverter and the fourth inverter have a common power source of the second power source $V_{pp}$. In this manner, the voltage level transfer of the invention can drive more load.

Furthermore, two or several voltage level transfers can be coupled together in series so as to handle a situation that a larger voltage difference exits between the first power source Vdd and the second power source $V_{pp}$.

BRIEF DESCRIPTION OF DRAWINGS

The invention can be more fully understood by reading the following detailed description of the preferred embodiment, with reference made to the accompanying drawings as followings.

DETAILED DESCRIPTION OF PREFERRED EMBODIMENT

Figure 3:
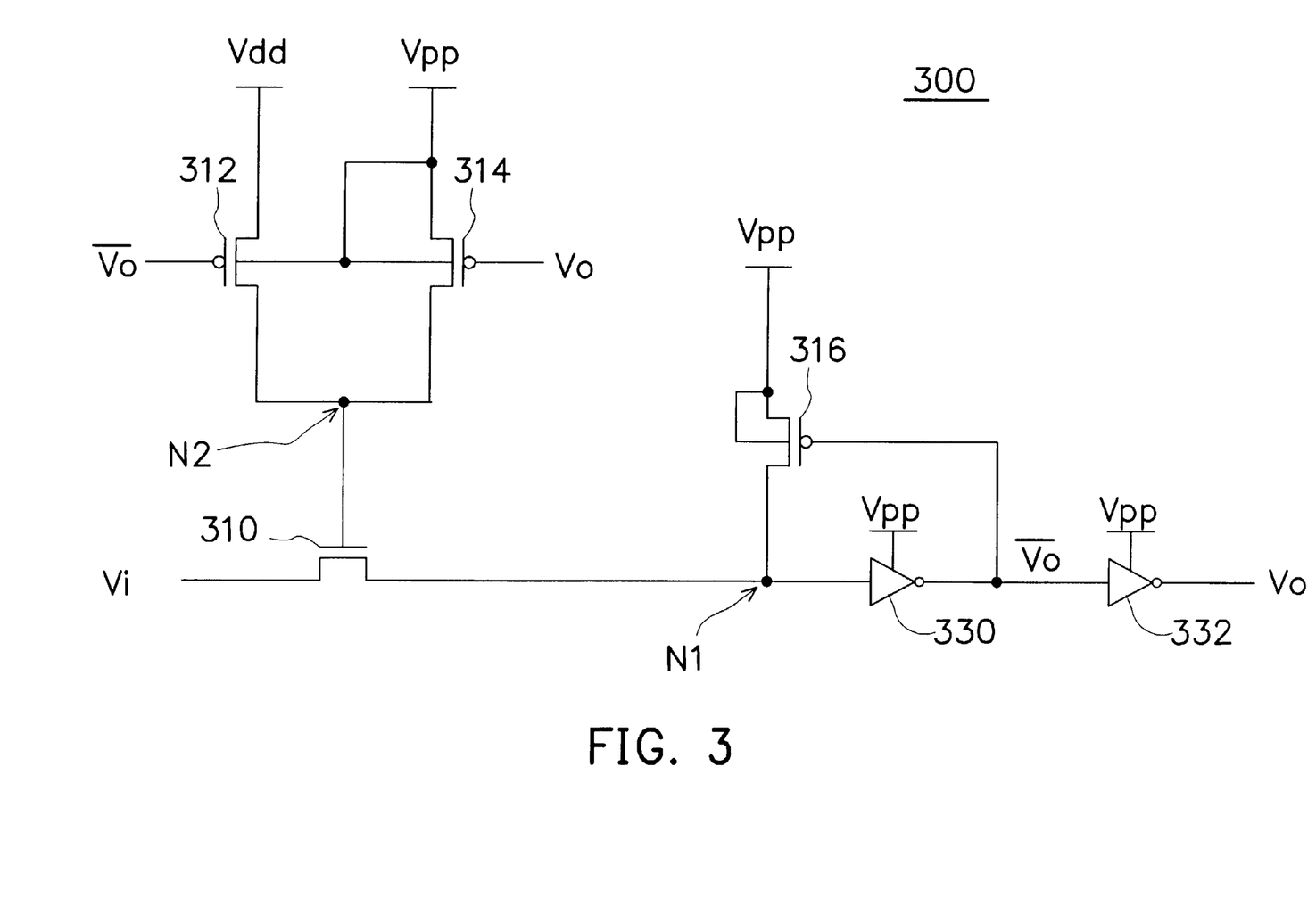
FIG. 3 is a circuit configuration, schematically illustrating a circuit architecture of a single-end-input voltage level transfer, according to a preferred embodiment of the invention.

FIG. 3 is a circuit configuration, schematically illustrating a circuit architecture of a single-end-input voltage level transfer, according to a preferred embodiment of the invention. In FIG. 3, an input signal Vi is to be transferred into an output signal Vo by a single-end-input voltage level transfer 300. The voltage level range of the input signal Vi is between 0V and a power source $V_{dd}$, and the voltage level range of the output signal Vo is between 0V and a power source $V_{pp}$, which is typically higher than the power source $V_{dd}$.

The voltage level transfer 300 at least includes, for example, a transistor 310, a transistor 312, a transistor 314, a transistor 316, and two inverters 330 and 332. The transistor 310 preferably includes an N-type metal-oxide-semiconductor (NMOS) transistor, and each of the other three transistors preferably includes a P-type metal-oxide-semiconductor (PMOS) transistor. The inverters 330 and 332 are powered by the power source $V_{pp}$.

An operating theory of the voltage level transfer 300 is described in the following.

An input end of the inverter 330 is denoted as a node N1, and a gate of the transistor 310 is denoted as a node N2. An output signal Vo and its complementary output signal $\overline{Vo}$ control the transistors 314 and 312, respectively, so that the N2 voltage level is changed. As the voltage level of the output signal Vo is 0V, the complementary output signal $\overline{Vo}$ is $V_{pp}$. In this situation, the transistor 312 is off and the transistor 314 is on. As a result, the N2 voltage level is $V_{pp}$. Similarly, as the voltage level of the output signal Vo is V the complementary output signal $\overline{Vo}$ is 0V. In this situation, the transistor 312 is on and the transistor 314 is off. As a result, the N2 voltage level is $V_{dd}$.

As an input signal Vi is at 0V, the N2 voltage level having either $V_{pp}$ or $V_{dd}$, turns on the transistor 310 so as to cause the N1 voltage level to be 0V. The voltage level of the complementary output signal $\overline{Vo}$ exported by the inverter 330 becomes $V_{pp}$, and the voltage level of the output signal Vo exported by the inverter 332 becomes 0V. Since the complementary output signal $\overline{Vo}$ is at $V_{pp}$, the transistor 316 is still not turned on. The N1 voltage level remains at 0V. As a result, the voltage level status of the output signal Vo and its complementary output signal $\overline{Vo}$ cause the transistor 314 on and the transistor 312 off. The N2 voltage level is $V_{pp}$.

As the voltage level of the input signal Vi rises up to $V_{dd}$, since the N2 voltage level is at $V_{pp}$, which is greater than $V_{dd}$, the N1 voltage level can rise up to about $V_{dd}$ also, causing a change of voltage level status of the output signal Vo and its complementary output signal $\overline{Vo}$. In this situation, the voltage level of the complementary output signal $\overline{Vo}$ exported by the inverter 330 is switched to 0V, and the voltage level of the output signal Vo exported by the inverter 332 is switched to $V_{pp}$. Due to this voltage level change, the transistor 312 is on and the transistor 314 is off, causing the N2 voltage level to be lowered down to $V_{dd}$. At this moment, the gate and the drain region of the transistor 310 have the same voltage level at $V_{dd}$, resulting in a 0V bias. The transistor 310 is therefore turned off, resulting in no current consumption of the transistor 310 between its gate and its drain region. Besides, the complementary output signal $\overline{Vo}$ at 0V causes the transistor 316 to be turned on. As a result, the N1 voltage level is raised up to $V_{pp}$ without a DC current in the inverter 330.

Inverters, as well known, are the basic elements of a complementary metal-oxide semiconductor (CMOS) digital circuit. An inverter has a shortest delay time and can respond in the fastest speed. The voltage level transfer of the invention makes use of the inverters 330 and 332 with their advantages so as to acquire a fast voltage-level switching ability. After a proper design, the current consumption on the transistor 310 is effectively reduced.

In summary at this stage, the voltage level transfer provided by the invention has a fast switching time with low power consumption. A conventional voltage level transfer needs longer time to achieve a switching action and is very power consuming.

Moreover, in the invention, there is no need of an extra inverter to produce a complementary input signal $\overline{Vi}$, which is needed in the conventional one. The complementary output signal $\overline{Vo}$ can be directly used in a next stage as an input.

Furthermore, in the conventional one, all the gates of the used transistors are controlled by a fixed voltage. In the invention, the gates of the transistors are controlled by a variable voltage so that the switch speed is faster and there is no DC current involved.

In the following descriptions, behaviors of voltage waveforms are schematically illustrated. FIGS. 4A–4D and FIGS. 5A–5D are voltage waveforms versus time, schematically illustrating voltage waveforms of the input signal Vi, the output signal Vo and the complementary output signal $\overline{Vo}$ at different node location of FIG. 3. The horizontal axis is for time with a unit of ns, which is $10^{-9}$ seconds. The vertical axis is for voltage level with a unit of volt.

Figure 4A:
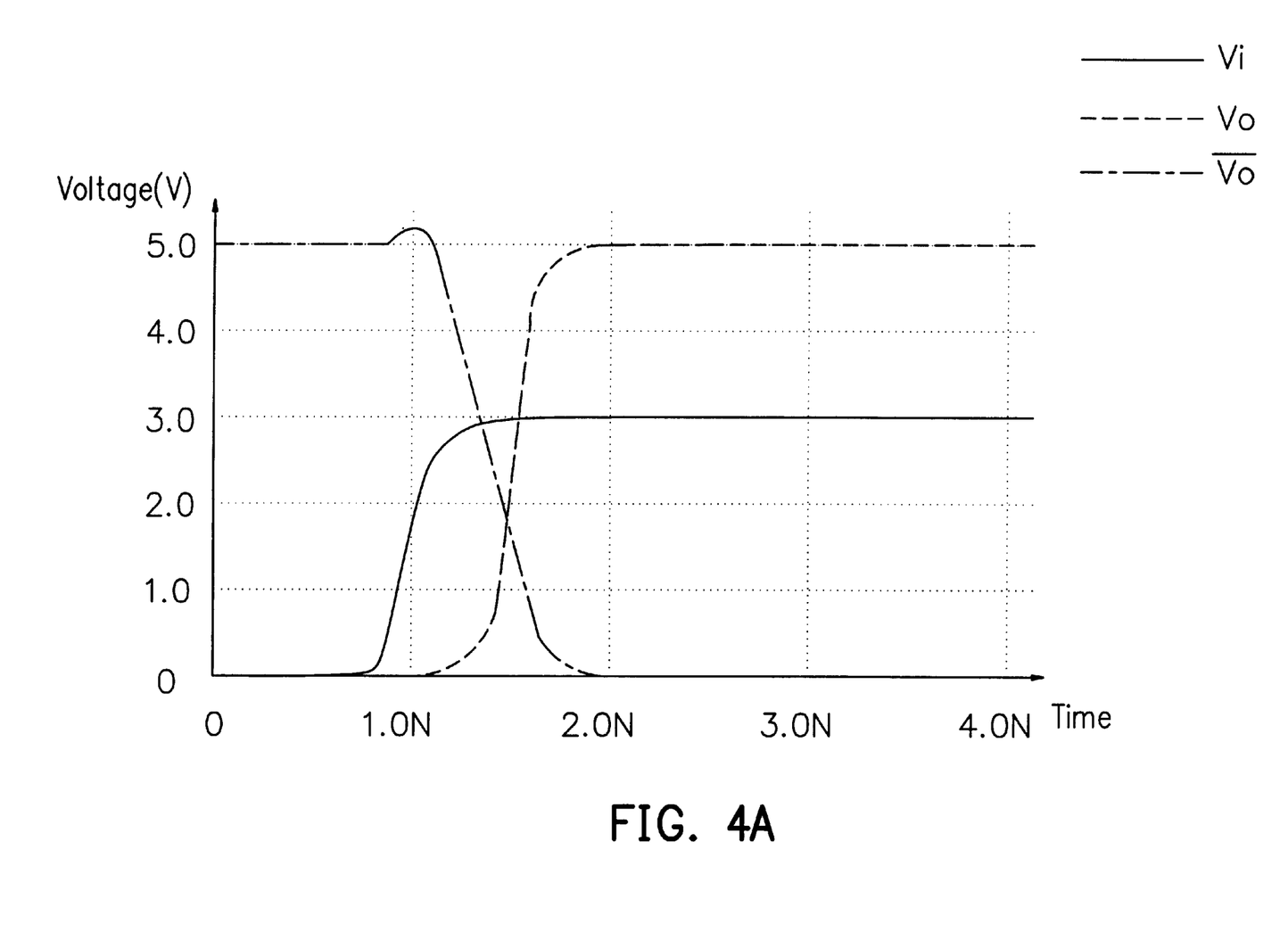
FIGS. 4A–4D and FIGS. 5A–5D are voltage waveforms versus time, schematically illustrating voltage waveforms of the input signal Vi, the output signal Vo and the complementary output signal $\overline{Vo}$ at different node location of FIG. 3.
Figure 4B:
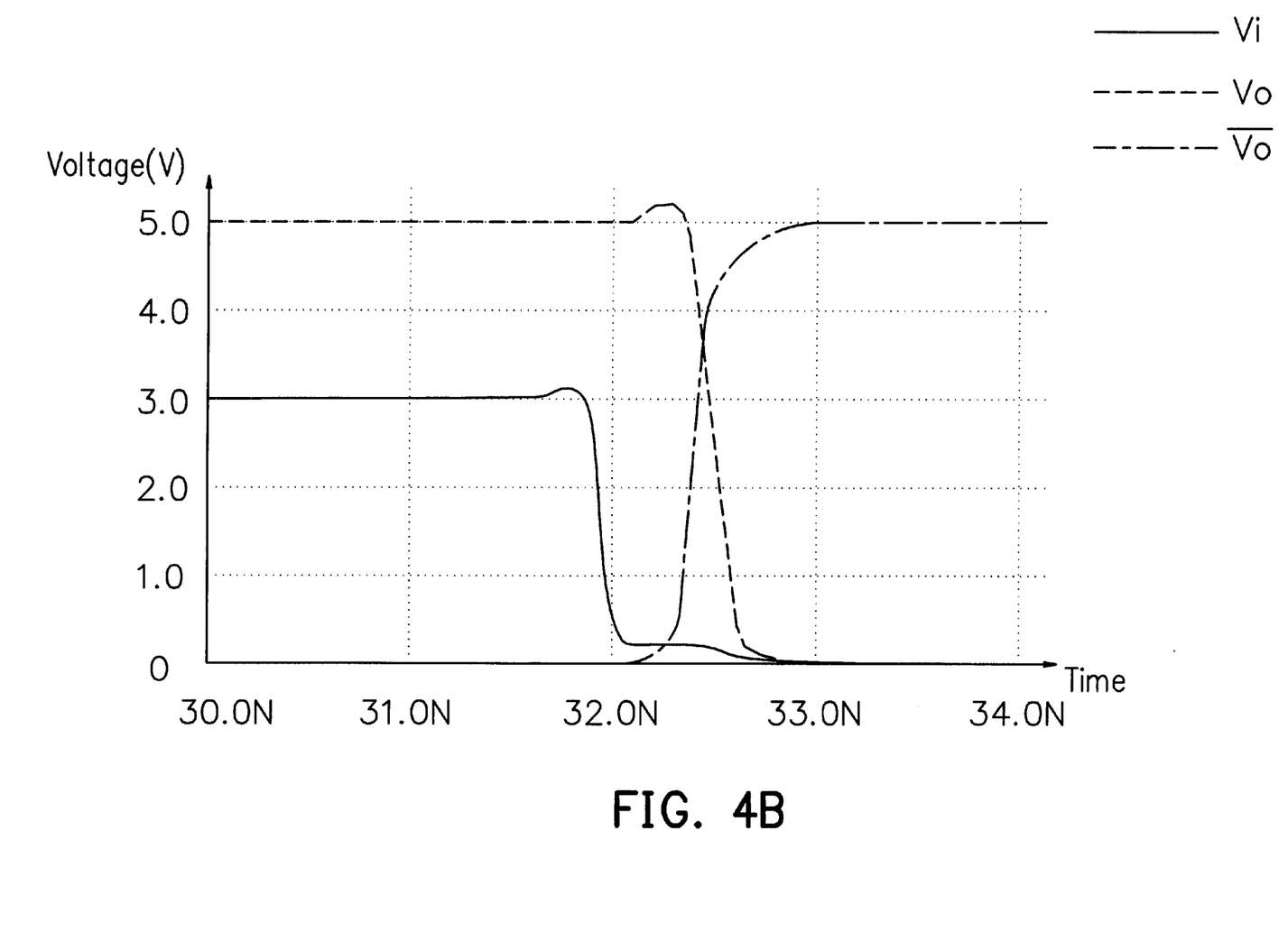
Figure 4C:
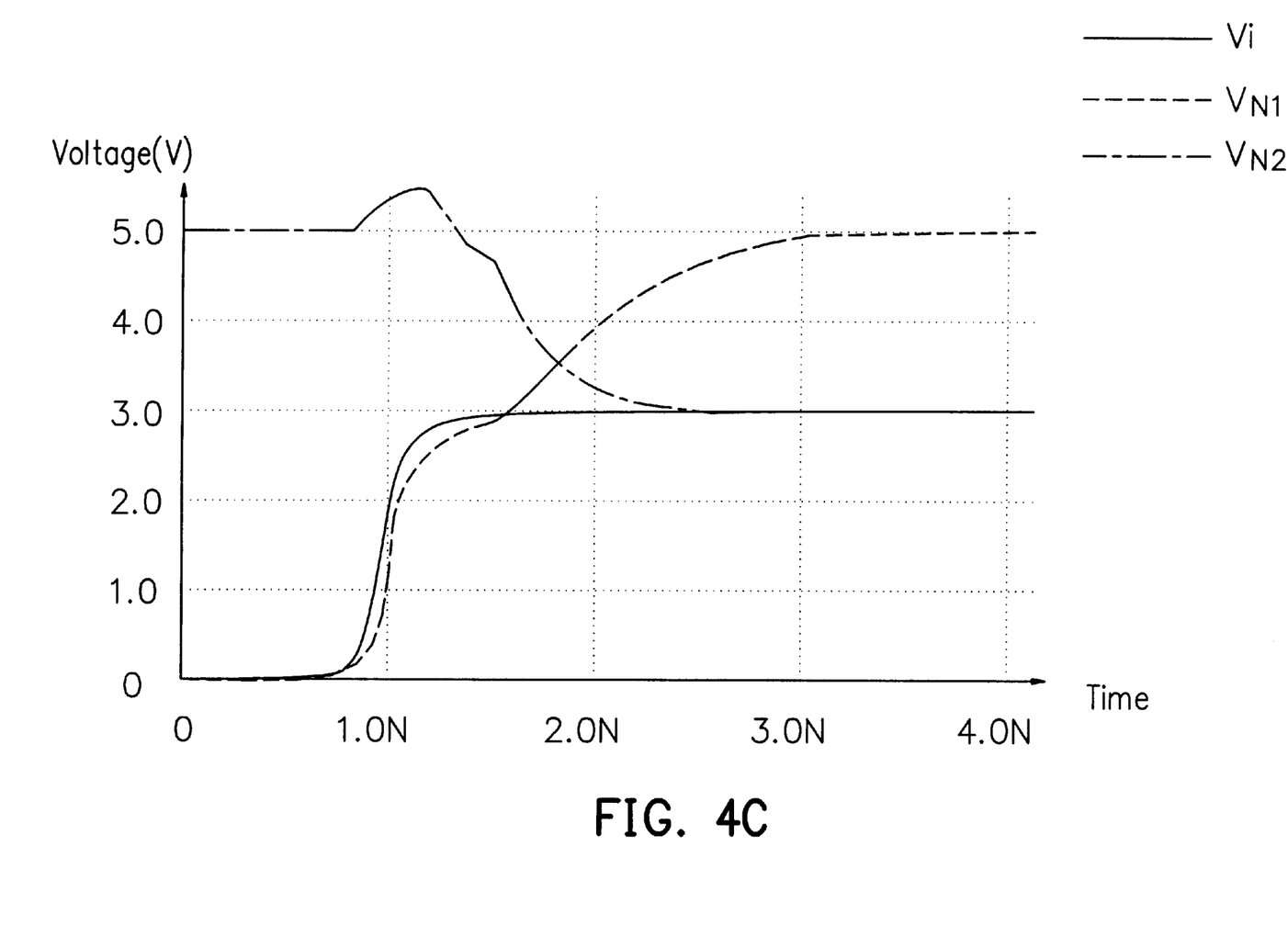
Figure 4D:
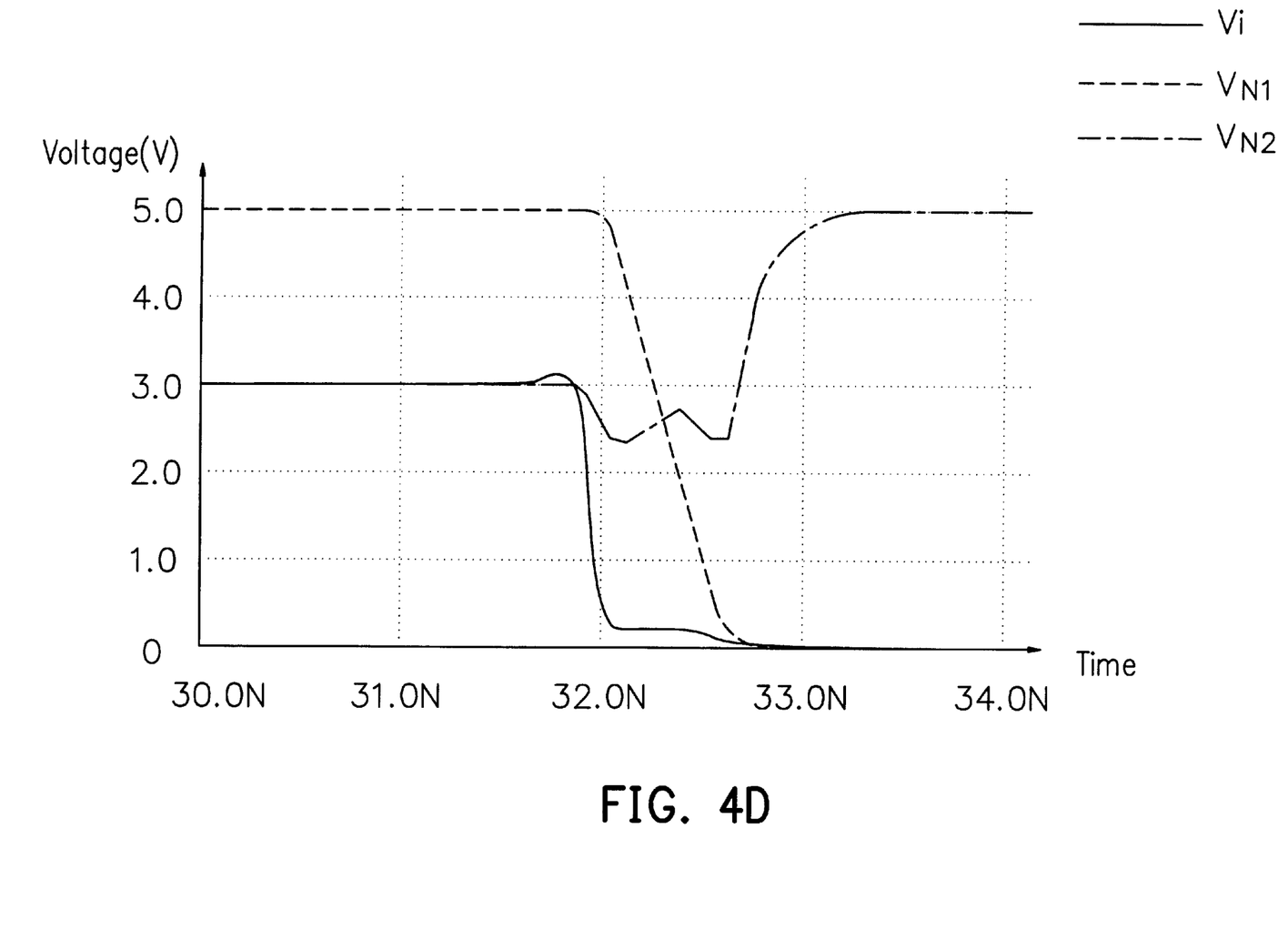

In FIGS. 4A–4D, the power source $V_{dd}$ is at 3V and the power source $V_{pp}$ is at 5.0V. In FIG. 4A, as the voltage level of the input signal Vi rises from 0V to 3V, the voltage level of the complementary output signal $\overline{Vo}$ falls down from 5V to 0V. The output signal Vo is raised up from 0V to 5V with a certain delay relative to the input signal Vi. In FIG. 4B, as the input signal Vi starts to change from 3V to 0V, the complementary output signal $\overline{Vo}$ rises from 0V up to 5V, and the output signal Vo falls from 5V down to 0 V with a little delay relative to the input signal Vi. As one can see, the response time needed by each voltage level change is about within 0.5 ns, which takes at least 1 ns in the conventional one. In FIG. 4C, as the input signal Vi rises from 0V up to 3V, the N1 voltage level $V_{N1}$ rises from 0V up to 5V, and the N2 voltage level $V_{N2}$ falls from 5V down to 3V. In FIG. 4D, as the input signal Vi falls from 3V down to 0V, the N1 voltage level $V_{N1}$ falls from 5V down to 0V, and the N2 voltage level $V_{N2}$ rises from 3V up to 5V.

Figure 5A:
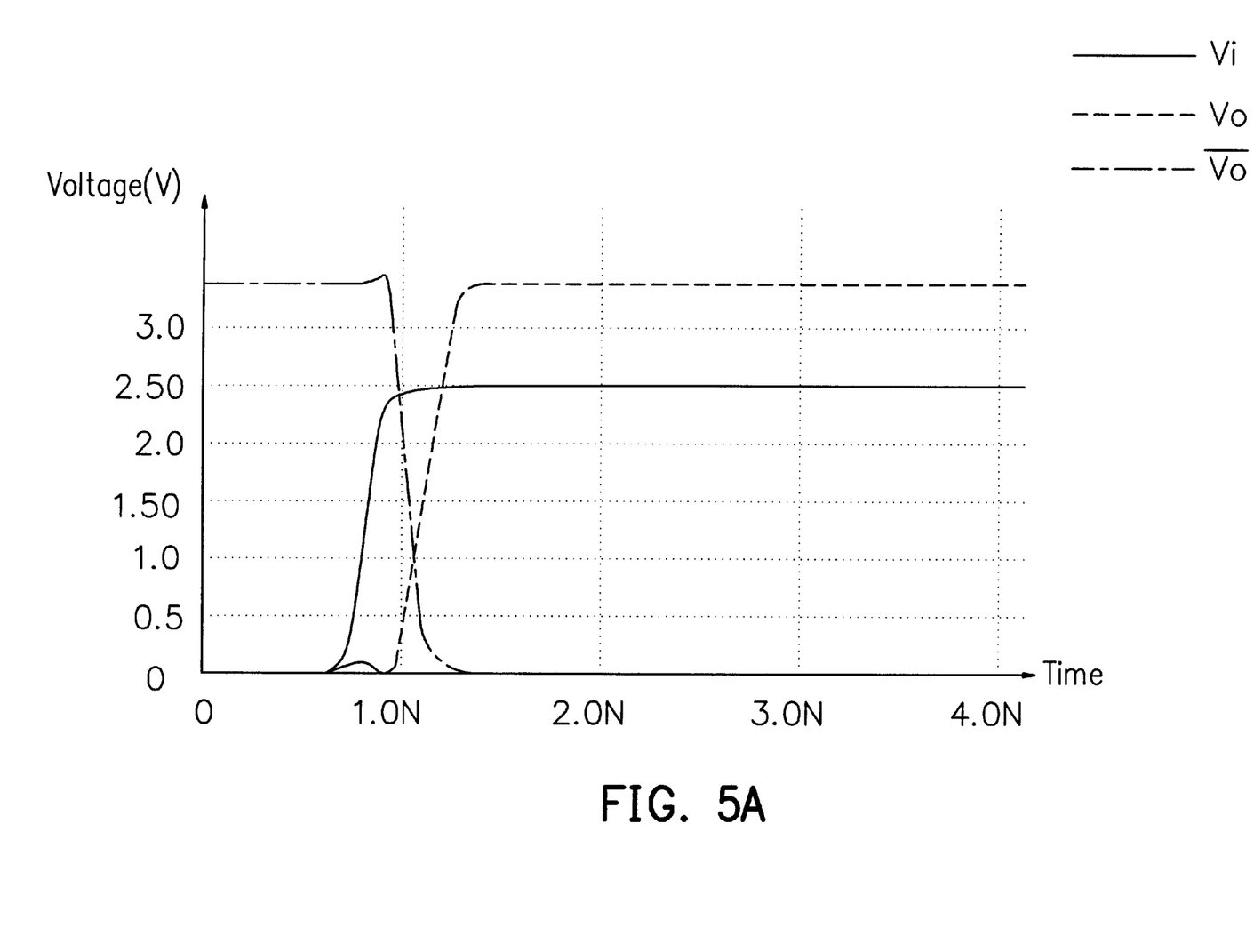
Figure 5B:
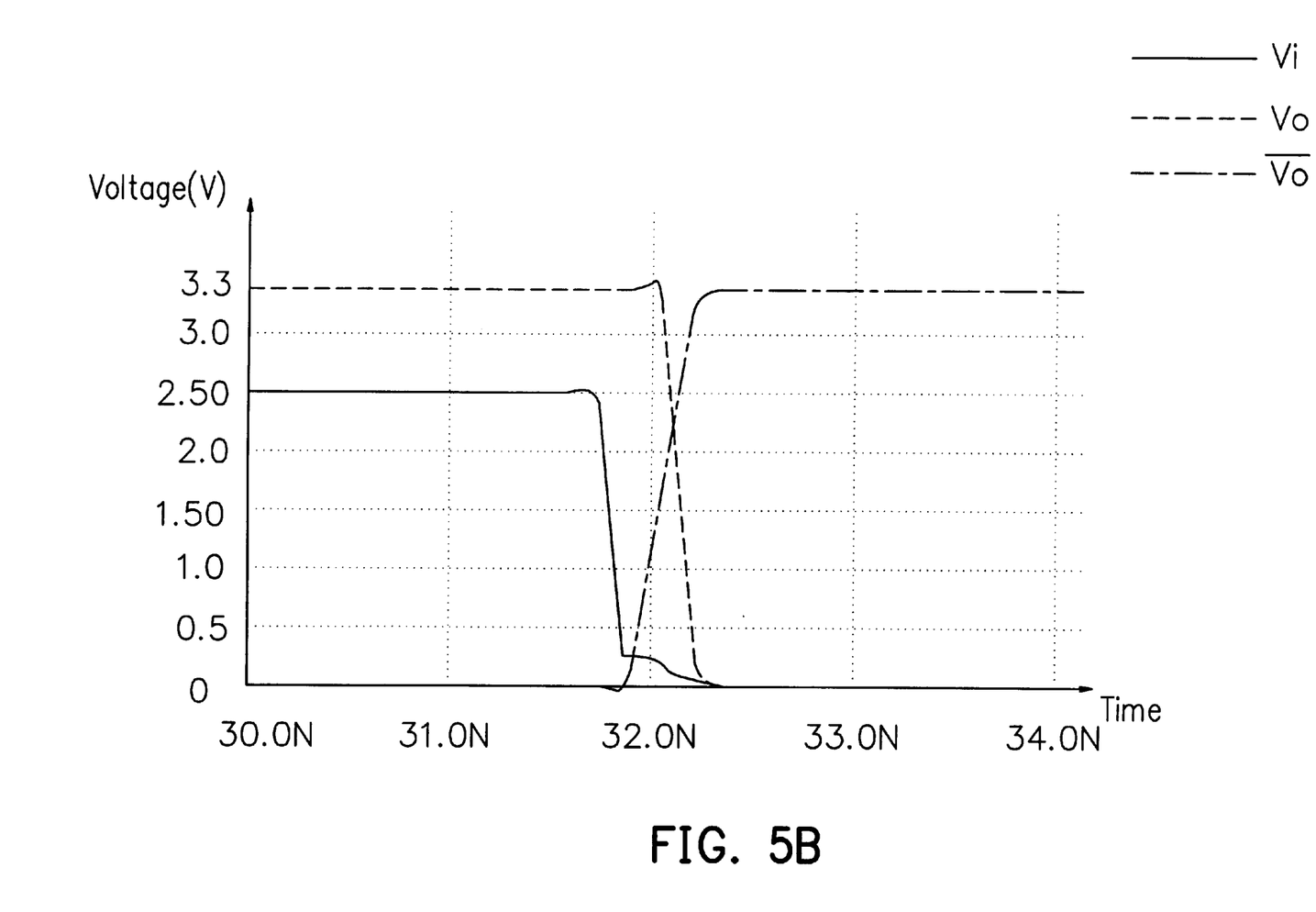
Figure 5C:
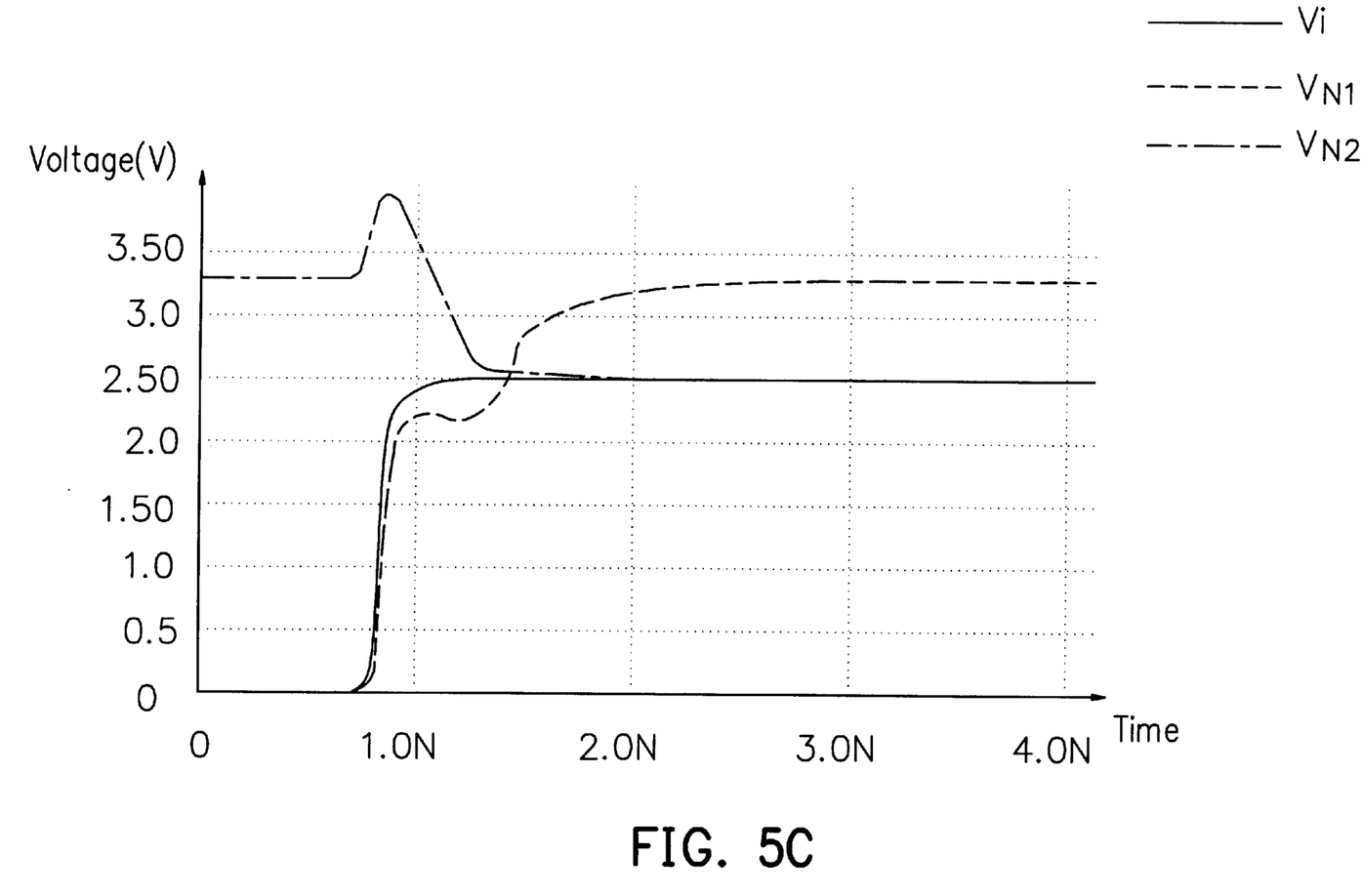
Figure 5D:
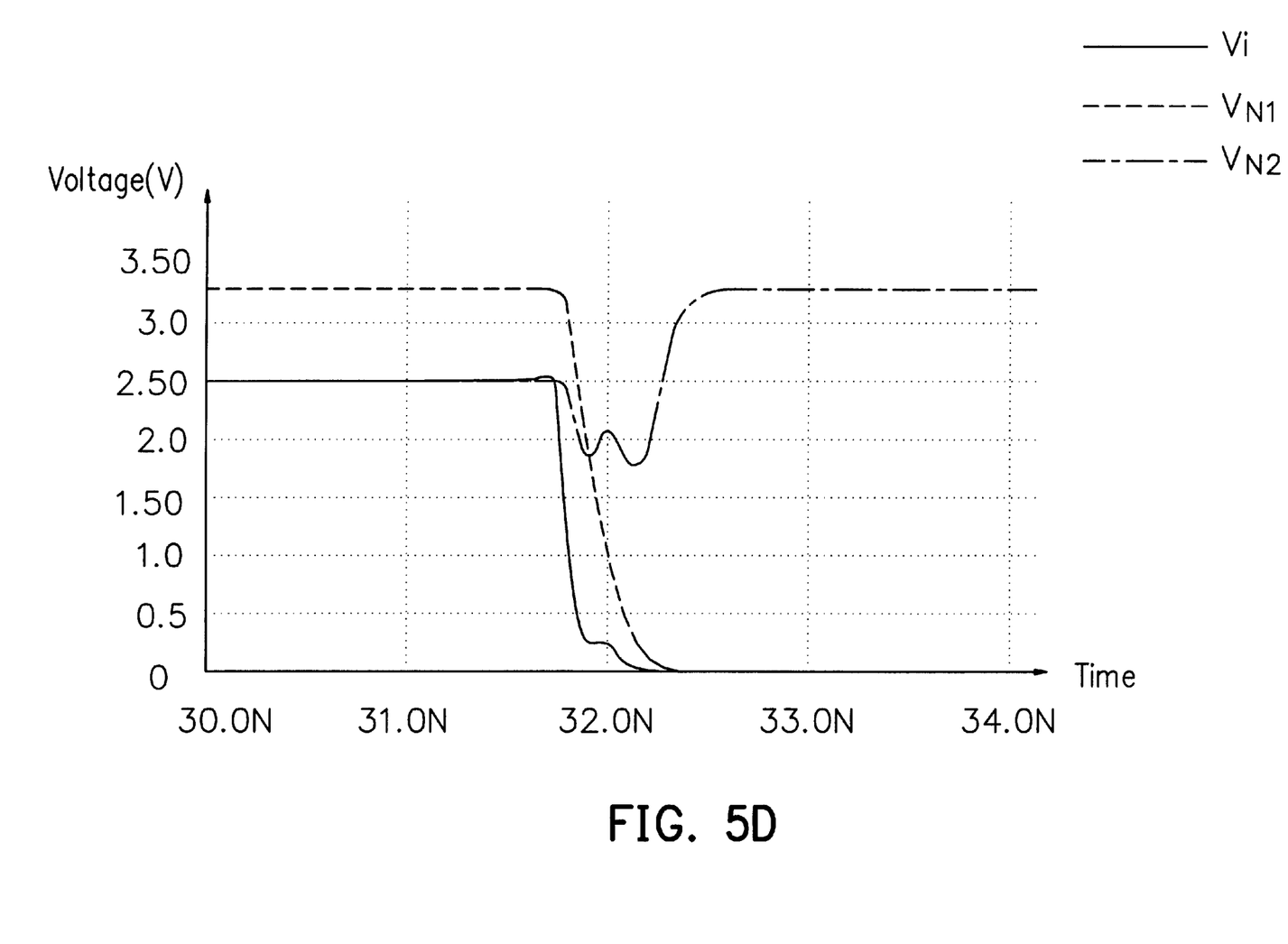

In FIGS. 5A–5D, the power source $V_{dd}$ is at 2.5V and the power source $V_{pp}$ is at 3.3V. In FIG. 5A, as the voltage level of the input signal Vi rises from 0V to 2.5V, the voltage level of the complementary output signal $\overline{Vo}$ falls down from 3.3V to 0V. The output signal Vo rises from 0V up to 3.3V with a certain delay relative to the input signal Vi. In FIG. 5B, as the input signal Vi starts to change from 2.5V to 0V, the complementary output signal $\overline{Vo}$ rises from 0V up to 3.3V, and the output signal Vo falls from 3.3V down to 0 V with a little delay relative to the input signal Vi. As one can see, the response time needed by each voltage level change is about within 0.3 ns. In FIG. 5C, as the input signal Vi rises from 0V up to 2.5V, the N1 voltage level $V_{N11}$ rises from 0V up to 3.3V, and the N2 voltage level $V_{N2}$ falls from 3.3V down to 2.5V. In FIG. 5D, as the input signal Vi falls from 2.5V down to 0V, the N1 voltage level $V_{N1}$ falls from 3.3V down to 0V, and the N2 voltage level $V_{N2}$ rises from 2.5V up to 3.3V.

It is concluded that the voltage level transfer provided by the invention has a response time less than 0.5 ns, whereas the conventional one needs at least 1 ns. The invention provides the voltage level transfer with faster response time by at least about factor of two.

Figure 6:
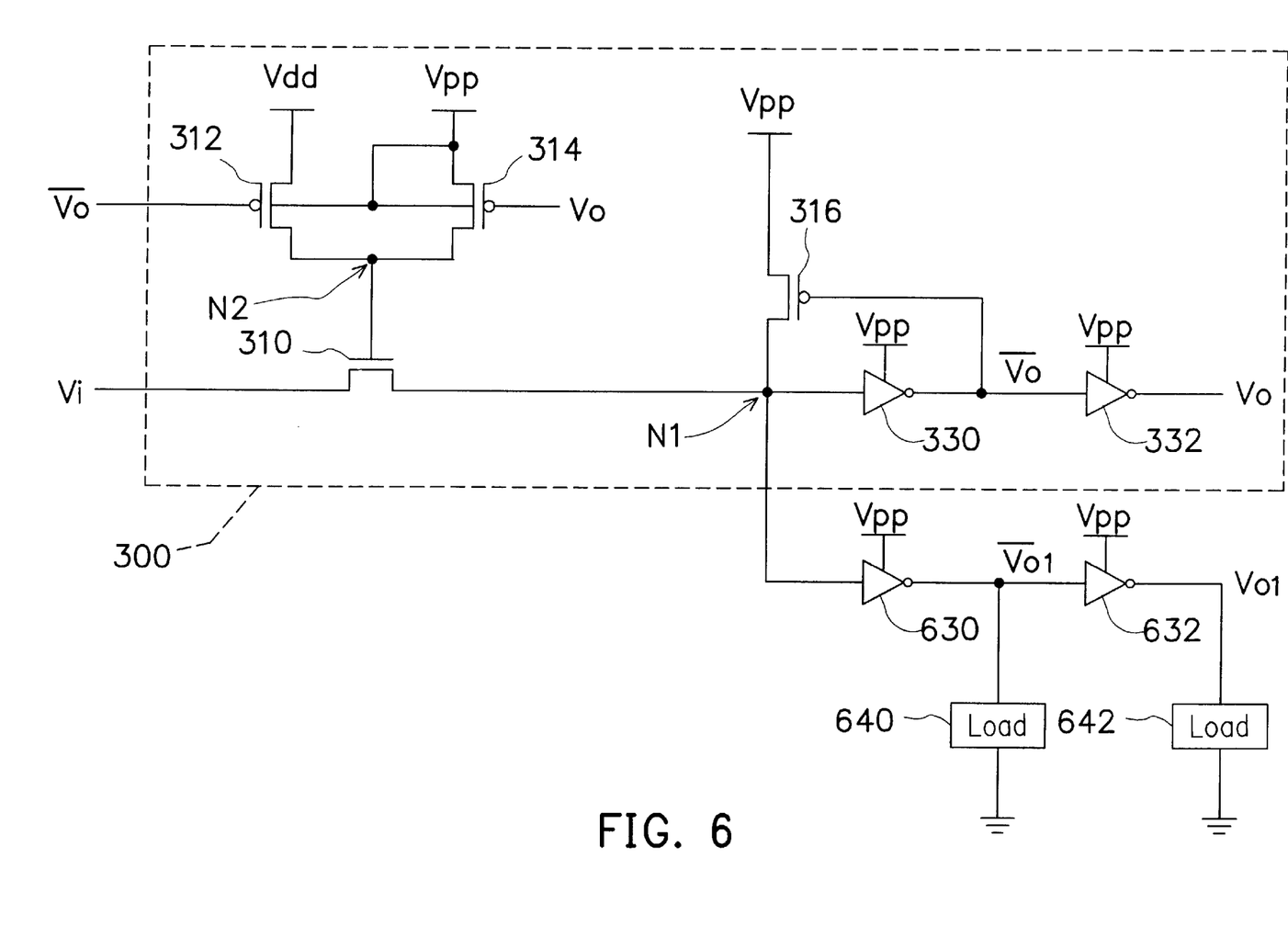
FIG. 6 is a circuit configuration, schematically illustrating a circuit architecture of a single-end-input voltage level transfer with additional inverters and loads, according to a preferred embodiment of the invention.

According to the circuit architecture disclosed in FIG. 3, its driving ability can be further enhanced by a circuit architecture shown in FIG. 6. FIG. 6 is a circuit configuration, schematically illustrating a circuit architecture of a single-end-input voltage level transfer with additional inverters and loads, according to a preferred embodiment of the invention.

In FIG. 6, in order to provide more powerful driving capability or drive a greater load, two inverters 630 and 632 are, for example, further included. An input end of the inverter 630 is coupled to the node N1, and an output end is coupled to a load 640 and an input end of the inverter 632. The output end of the inverter 632 is coupled to a load 642. The load 640 and the load 642 are grounded at their other ends. The inverters 630 and 632 are also powered by the power source $V_{pp}$ so that a complementary output signal $\overline{Vo_1}$ of the inverter 630 is equal to the $\overline{Vo}$, and an output signal $Vo_1$ is equal to the Vo. Due to the inverters 630 and 632, the voltage level transfer 300 can drive more loads 640 and 642. The circuit response time still remains fast as well.

Figure 7:
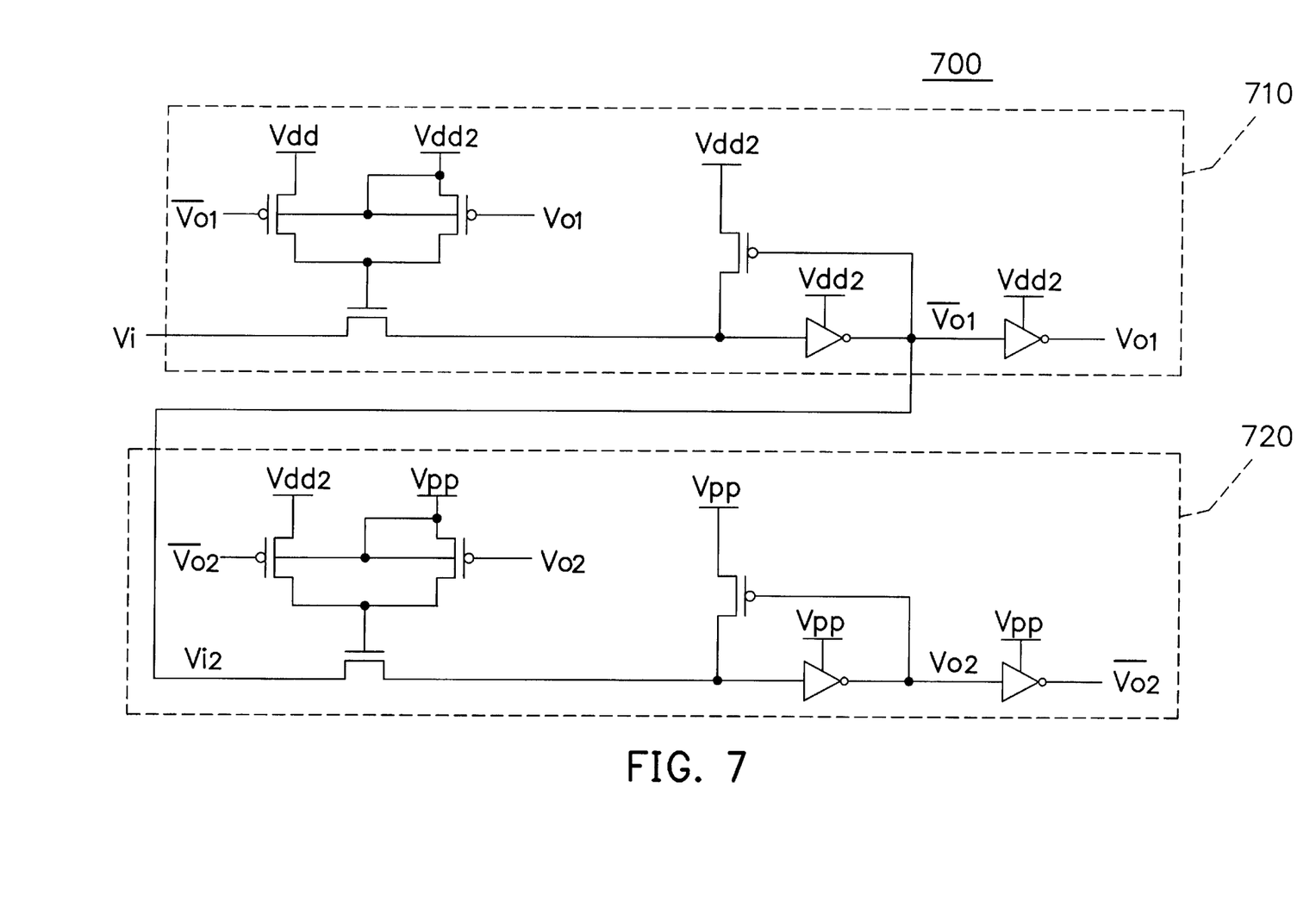
FIG. 7 is a circuit configuration, schematically illustrating a series coupling between two circuit architectures of a single-end-input voltage level transfer, according to a preferred embodiment of the invention.

Furthermore, if the voltage difference between the input signal and the output signal is large, such as $V_{dd} \ll V_{pp}$, the desired output signal can be achieved by two or more units of the voltage level transfer 300, which are coupled together in series so as to optimize the response time and power consumption. FIG. 7 is a circuit configuration, schematically illustrating a series coupling between two circuit architectures of a single-end-input voltage level transfer, according to a preferred embodiment of the invention. In FIG. 7, a two-level voltage level transfer 700 is, for example, illustrated. The two-level voltage level transfer 700 includes a first voltage level transfer 710 to serve as the first level unit and a second voltage level transfer 720 to serve as the second level unit, in which the first voltage level transfer 710 and the second voltage level transfer 720 have a similar circuit architecture to the voltage level transfer 300 shown in FIG. 3 except the quantities of the power sources. The input signal $V_{i2}$ of the second voltage level transfer 720 is a complementary output signal $\overline{Vo_1}$ of the first voltage level transfer 710, which receives the input signal Vi. The voltage level of the input signal Vi includes a range between 0V and $V_{dd}$, and the voltage level of the output signal $Vo_1$ and its complementary output signal $\overline{Vo_1}$ includes a range between 0V and $V_{dd2}$. The voltage level of the voltage level of the output signal $Vo_2$ and its complementary output signal $\overline{Vo_2}$ includes a range between 0V and $V_{pp}$.

In conclusion, the voltage level transfer provided by the invention has a fast switching time with low power consumption. The driving capability of the voltage level transfer can be further enhanced by simply adding extra inverters to drive more loads. If the voltage difference between $V_{dd}$ and $V_{pp}$ is large, at least two units of the single voltage level transfer can be coupled together in series so as to achieve the voltage level transferring goal from $V_{dd}$ to $V_{pp}$ with optimized response time and power consumption.

The invention having been described uses an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What claimed is:

1. A single-end-input voltage level transfer, which is controlled by a gate voltage for converting a first signal to a second signal, the voltage level transfer comprising:

a first transistor with a first drain region, a first source region, and a first gate, in which the first source region is coupled to the first signal;

a first inverter, wherein an input end of the first inverter is coupled to the first drain region of the first transistor and the first inverter exports a complementary second signal, which is complementary to the second signal;

a second inverter, wherein an input end of the second inverter is coupled to an output end of the first inverter, and the second inverter exports the second signal;

a second transistor with a second drain region, a second source region, and a second gate, wherein the second source region is coupled to a first power source, the second drain region is coupled to the first gate, and the second gate is controlled by the complementary second signal;

a third transistor with a third drain region, a third source region, and a third gate, wherein the third source region is coupled to a second power source, the third drain region is coupled to the first gate, and the third gate is controlled by the second signal; and a fourth transistor with a fourth drain region, a fourth source region, and a fourth gate, wherein the fourth drain region is coupled to the first inverter at its input end, the fourth source region is coupled to the second power source, and the fourth gate is coupled to the first inverter at its output end.

2. The voltage level transfer of claim 1, wherein the first signal comprises a voltage waveform ranging from 0V to a voltage level of the first power source.

3. The voltage level transfer of claim 1, wherein the second signal comprises a voltage waveform ranging from 0V to a voltage level of the second power source.

4. The voltage level transfer of claim 1, wherein the first inverter and the second inverter are powered by the second power source.

5. The voltage level transfer of claim 1, wherein the first transistor comprises an N-type metal-oxide semiconductor (NMOS) transistor.

6. The voltage level transfer of claim 1, wherein each of the second transistor, the third transistor, and the fourth transistor comprises a P-type metal-oxide semiconductor (PMOS) transistor.

7. The voltage level transfer of claim 1, wherein the fourth transistor comprises a relatively small driving ability.

8. The voltage level transfer of claim 1, wherein a substrate of the second transistor and a substrate of the third substrate are commonly coupled to the second power source.

9. The voltage level transfer of claim 1, wherein the voltage level of the second power source is higher than the voltage level of the first power source.

10. The voltage level transfer of claim 1, wherein the voltage level transfer further comprises a third inverter and a fourth inverter, both of which are coupled in series and powered by the second power source, and an input end of the third inverter is coupled to the first drain region, wherein an output end of the third inverter is separately coupled to a first additional load and an input end of the fourth inverter, and an output end of the fourth inverter is separately coupled to a second additional load.

11. A single-end-input voltage level transfer unit, which is controlled by a gate voltage and is suitable for transferring from a first signal to a second signal, the voltage level transfer using a first power source and a second power source that has a higher voltage level than a voltage level of the first power source, the voltage level transfer unit comprising:

a first transistor with a first drain region, a first source region, and a first gate, in which the first source region receives the first signal;

a first inverter, wherein an input end of the first inverter is coupled to the first drain region of the first transistor and the first inverter exports a complementary second signal, which is complementary to the second signal;

a second inverter, wherein an input end of the second inverter is coupled to an output end of the first inverter, and the second inverter exports the second signal;

a second transistor with a second drain region, a second source region, and a second gate, wherein the second source region is coupled to the first power source, the second drain region is coupled to the first gate, and the second gate is controlled by the complementary second signal;

a third transistor with a third drain region, a third source region, and a third gate, wherein the third source region is coupled to the second power source, the third drain region is coupled to the first gate, and the third gate is controlled by the second signal; and a fourth transistor with a fourth drain region, a fourth source region, and a fourth gate, wherein the fourth drain region is coupled to the first inverter at its input end, the fourth source region is coupled to the second power source, and the fourth gate is coupled to the first inverter at its output end, wherein the first inverter and the second inverter are powered by the second power source.

12. The voltage level transfer unit of claim 11, wherein the first signal comprises a voltage waveform ranging from 0V to a voltage level of the first power source.

13. The voltage level transfer unit of claim 11, wherein the second signal comprises a voltage waveform ranging from 0V to a voltage level of the second power source.

14. The voltage level transfer unit of claim 11, wherein the first transistor comprises an N-type metal-oxide semiconductor (NMOS) transistor.

15. The voltage level transfer unit of claim 11 wherein each of the second transistor, the third transistor, and the fourth transistor comprises a P-type metal-oxide semiconductor (PMOS) transistor.

16. The voltage level transfer unit of claim 11, wherein the fourth transistor comprises a relatively small driving ability.

17. The voltage level transfer unit of claim 11, wherein a substrate of the second transistor and a substrate of the third substrate are commonly coupled to the second power source.

18. The voltage level transfer unit of claim 11, wherein the voltage level transfer further comprises a third inverter and a fourth inverter, both of which are coupled in series and powered by the second power source, and an input end of the third inverter is coupled to the first drain region, wherein an output end of the third inverter is separately coupled to a first additional load and an input end of the fourth inverter, and an output end of the fourth inverter is separately coupled to a second additional load.

19. The voltage level transfer unit of claim 11, wherein the voltage level transfer unit functions as a first-level unit and is coupled in series with another identical voltage level transfer unit serving as a second-level unit, in which the output end of the first inverter of the first-level unit is coupled to a first source region of the second-level unit.

\* \* \* \* \*